United States Patent [19]

Calviello

[11] 4,098,921
[45] Jul. 4, 1978

[54] TANTALUM-GALLIUM ARSENIDE SCHOTTKY BARRIER SEMICONDUCTOR DEVICE

[75] Inventor: Joseph A. Calviello, Kings Park, N.Y.

[73] Assignee: Cutler-Hammer, Milwaukee, Wis.

[21] Appl. No.: 681,197

[22] Filed: Apr. 28, 1976

[51] Int. Cl.² .......................... H01C 7/00; H01G 9/00
[52] U.S. Cl. .......................................... 427/53; 427/82;
427/84; 148/6.14 R; 357/52; 357/15
[58] Field of Search ............... 427/84, 82, 53; 357/52; 148/6.14 R

[56] References Cited
U.S. PATENT DOCUMENTS

| | | |
|---|---|---|
| 3,896,254 | 7/1975 | Berkner ............................. 427/53 X |
| 3,914,465 | 10/1975 | Dyment ............................. 375/52 X |
| 3,923,975 | 12/1975 | Calviello ............................ 427/84 |

*Primary Examiner*—Ralph S. Kendall
*Attorney, Agent, or Firm*—Kevin Redmond

[57] ABSTRACT

A Schottky barrier semiconductor device wherein the semiconductor is gallium arsenide and the metal electrode is tantalum, passivated by formation of native oxides after the metal-semiconductor junction is made. Tantalum acts as a diffusion shield, enabling use of gold as a direct contact on the electrode.

5 Claims, 4 Drawing Figures

U.S. Patent  July 4, 1978  4,098,921
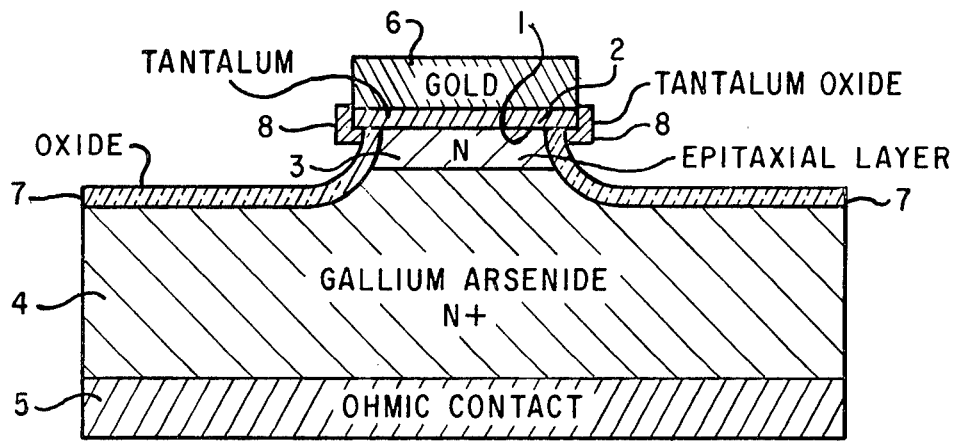
FIGURE 1
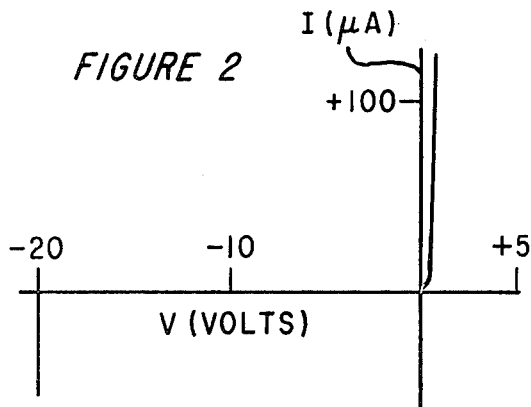
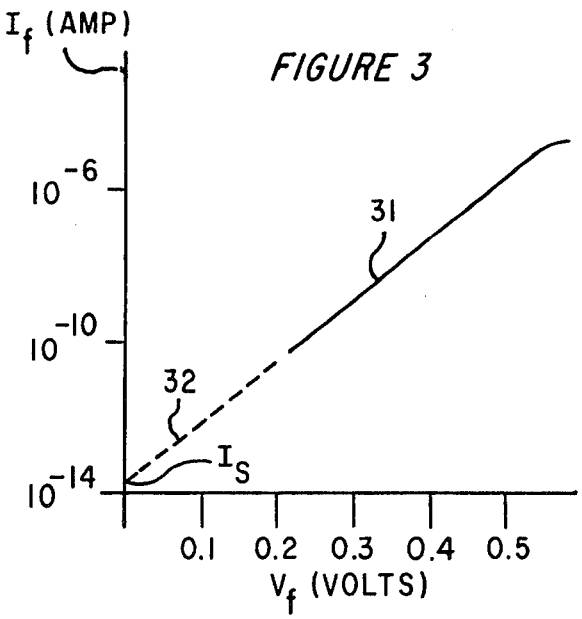
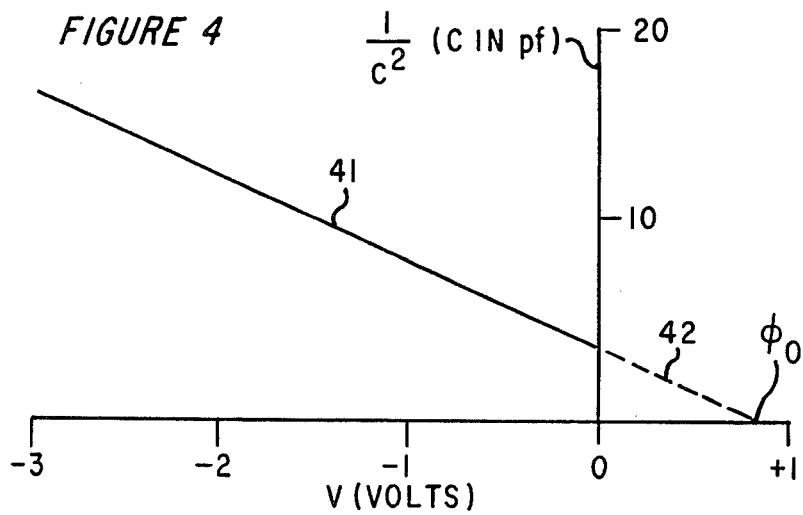

TANTALUM-GALLIUM ARSENIDE SCHOTTKY BARRIER SEMICONDUCTOR DEVICE

BACKGROUND

This invention relates to improvements in Schottky barrier semiconductor devices. Such devices are generally well known, for example in the form of asymmetrically conductive diodes comprising a body of appropriately doped semiconductor such as gallium arsenide with a region of its surface in intimate contact with an electrode of metal having a suitable work function, such as nickel, molybdenum, tungsten, palladium, or gold. The electrode is usually in the form of a thin film, deposited on the semiconductor by conventional techniques.

All of the metals used heretofore as Schottky electrodes exhibit one or more undersirable characteristics that require special countermeasures, which are usually expensive and not always fully satisfactory, in fabrication of the devices. For example, nickel films are brittle and vulnerable to mechanical stress; tungsten tends to form conductive whiskers that short-circuit the edge of the barrier; gold, an otherwise nearly ideal material, duffuses into the semiconductor and destroys its characteristics, particularly at higher temperatures within the desired operating range of the device.

For several reasons, for example its good thermal and electrical conductivity, its adaptability to thermal compression bonding, and resistance to corrosion, gold is also a nearly ideal material for making contact between the Schottky electrode and the external circuit. However, it diffuses readily through some metals such as palladium that would otherwise be suitable as electrodes. The prior art solution to this problem has been to provide a diffusion shield between the Schottky electrode and the gold terminal, comprising a film of some metal that resists gold diffusion.

The metals suitable as diffusion shields have such temperature coefficients of expansion that they must be sandwiched between additional metal layers of intermediate temperature coefficient to prevent destruction of the electrodecontact structure due to normal temperature variations. The two or more additional metal layers required in prior art practice contribute substantially to the cost and difficulty of fabricating such devices.

Passivation of the semiconductor device in prior art practice usually involves a sequence of steps such as deposition of one or more layers of insulating film and selective etching to define the desired patterns. The periphery of the barrier formed by the metal-semiconductor junction is particularly vulnerable to ambient reagents such as oxygen, water and sodium ions, and requires special precautions, as described in U.S. Pat. No. 3,635,417, for example.

SUMMARY

The principal object of this invention is to provide gallium arsenide Schottky barrier devices that exhibit highly stable nearly ideal electrical characteristics undegraded by high temperature operation, and that are adapted to simple and economical fabrication.

According to this invention, improvements in such devices and in the method of making them are achieved by direct deposition of a tantalum electrode on a gallium arsenide substrate, direct deposition of a gold contact on the tantalum electrode, then formation of native oxide film on the exposed areas of the electrode and substrate for passivation. Tantalum is effective as a gold diffusion shield, requiring no intermediate shield layers, and has a temperature coefficient of expansion nearly equal to that of gallium arsenide, enabling operation of the device at elevated temperatures without mechanical or electrical degradation. The native oxides are stable and impervious. Improved yield in manufacturing is attained because the barrier can be made immediately after cleaning the substrate, minimizing the possibility of contamination or oxidation of the cleaned surface, and the back contact can be made subsequently. The barrier and electrode structure will resist, without damage, the high temperature needed in forming the back contact.

DRAWING

FIG. 1 is a sectional view of a Schottky diode illustrating a presently preferred embodiment of the invention.

FIG. 2 is a graph of the voltage-current characteristic of the diode of FIG. 1.

FIG. 3 is another graph, in semi-log form, of the initial forward-conducting portion of said characteristic.

FIG. 4 is a graph showing the relationship between bias and a function of barrier capacitance of said diode.

DESCRIPTION

The diode to be described is particularly useful as a varactor in low noise high frequency parametric amplifiers. Modifications thereof, involving no difference in the application of the present invention, may be designed for other uses, as frequency multipliers, limiters and impart oscillators, for example.

Referring to FIG. 1, the Schottky barrier 1 is the interface or junction between a tantalum electrode 2 and the upper surface of an N-type epitaxial layer 3 of gallium arsenide, supported on an N+ gallium arsenide substrate 4 which is provided with an ohmic contact 5 on its lower surface. A gold contact 6 on the upper surface of the tantalum electrode 2 provides for easy connection of the device to external circuit means, as by thermal compressive bonding thereto of a gold ribbon, not shown.

The epitaxial layer 3 and the substrate immediately adjacent to it are shaped as a short mesa, whereby the plane of the barrier 1 is slightly higher than the general level of the surrounding upper surface of the N+ substrate 4. The tantalum electrode 2 overhangs the top of the epitaxial region 3, extending outwardly beyond the periphery of the barrier 1 as shown. The lower surface of the overhanging part of the tantalum electrode forms an angle of about 90° with the nearby side surface of the epitaxial material.

The entire upper surface of the gallium oxide member, except for that portion in contact with the tantalum electrode, is covered with a film of native oxide, formed in place as will be described. The edge of the tantalum electrode, and that part of the lower surface of the overhanging area not covered with the oxide film 7, is covered with a film 8 of tantalum oxide, also formed in place.

In a typical varactor diode, the epitaxial layer 3 is about 12 microns in diameter and 0.4 microns thick, with a donor concentration of about $8 \times 10^{16}$ atoms per cm$^3$. The donor may be sulphur or tellurium. The substrate 4 is preferably about 80 microns thick. The tantalum electrode 2 is about 2000A thick. The gold contact member 6 should be about 1 micron or more in thickness, for reliable bonding to an external conductor.

The voltage-current characteristic curve of FIG. 2 is a copy, approximately full scale, of an oscilloscope display of said characteristic. On this scale, the reverse leakage current is imperceptible, and the curve coincides with the abscissa between zero and the avalanche breakdown at about −20 volts. The knee of the curve at that point is very abrupt, visually indistinguishable in the display from a right angle, indicating uniformity of the field throughout junction area and the absence of defects at the edge of the junction.

FIG. 3 shows, on a different scale, the characteristic represented by the curve of FIG. 2 between zero and about +0.6 volt. The solid portion 31 of the curve of FIG. 3 was plotted point by point, using an electrometer device capable of measuring currents as low as $10^{-12}$ ampere with useful accuracy. The ordinate, in amperes, is logarithmic, causing the exponential relationship between voltage and current in this region to appear as a straight line in the graph. Downward extrapolation of the curve 31, indicated by the dash line 32, intercepts the ordinate at about $3 \times 10^{-14}$ ampere, implying that the reverse saturation current $I_s$ is of that value. The data illustrated by FIG. 3 enables calculation of the diode parameter $n$, which is about 1.06 in the case of the described device. This value indicates a Schottky barrier of good quality, by usual standards.

FIG. 4 shows $1/C^2$ as a function of voltage for the device of FIG. 1, where C is the barrier capacitance in picofarads. The straight-line appearance of the graph 41 in the reverse bias region indicates a normal varactor characteristic. The extrapolation into the forward bias region represented by the dash line 43 intercepts the abscissa at 0.8 volt, implying that the build-in voltage or contact potential $\phi_o$ is of that value, which is close to that theoretically expected in this case.

Schottky diodes of the above described construction have been maintained at 250° C in ambient for 120 hours without detectable change in the characteristics shown in FIGS. 2, 3 and 4. Present evidence supports the belief that such diodes will withstand and can be operated at considerably higher temperatures, say about 300° C.

The method of making devices like that of FIG. 1 includes the usual preliminary steps of lapping the starting wafer of gallium arsenide to provide the desired thicknesses of the N epitaxial layer and N+ substrate, then cleaning, rinsing and drying, using conventional reagents.

Immediately after cleaning, the wafer is placed in a vacuum system of the type used for deposition of metal films by evaporation, with a mask perforated to expose the areas where Schottky electrodes are to be formed, and suitable provisions for evaporating first tantalum, then gold. The system is then evacuated to a pressure of about $10^{-8}$ mm Hg, and an ion pump maintained in operation to minimize active residual gases in the chamber, thereby preventing oxidation of the tantalum and deposition of tantalum oxide instead of tantalum.

The tantalum is evaporated, interrupting the process if necessary to avoid overheating and to maintain the system pressure below about $10^{-5}$ mm Hg, until a film of about 2000A thick has been deposited. Then a layer of gold about 1 micron thick is deposited. The gold tends to spread slightly beyond the edge of the tantalum during deposition, forming a thin halo surrounding each deposit. The halos are removed by sputter etching, followed by acid etching, or other usual procedure.

At this stage, the wafer carries an array of perhaps 1000 or more gold-covered tantalum deposits, and is ready for further processing to eventually produce a batch of diodes. Although the above procedure is preferred at present, it will be understood that the array could be produced by using known photomasking and etching techniques instead of the perforated mask.

Preferably, the next step is the formation of an ohmic contact layer on the back side of the wafer, i.e. on the surface opposite the tantalum spots. This may be accomplished by a conventional technique, such as evaporation and sinter alloying of silver, tin and palladium. The usual prior practice has been to form the back contact before forming the Schottky electrodes, because the high temperature required for sintering, about 420° C, would degrade or destroy a previously formed barrier. The Schottky of the electrode structure of the present invention is not damaged by such temperature, and so may be formed before the back contact.

The wafer is then etched in known manner to remove the exposed epitaxial layer and some of the N+ substrate, forming a shallow mesa like that shown in FIG. 1 under each tantalum deposit. As a specific example, the etching may be effected by immersion of the wafer in a solution of 3 parts sulphuric acid, 1 part hydrogen peroxide and 1 part water with mild agitation for two minutes, followed by immersion in a solution of 8 parts sulphuric acid, 1 part hydrogen peroxide and 1 part water for one minute. This degree of etching, or its equivalent, results in a slight undercut of the gallium arsenide below the tantalum, exposing the lower surface of the electrode in an overhanging annular region around the barrier, as described above and shown in FIG. 1.

After rinsing and partial drying, the wafer is baked or cured in air or oxidant gas for 30 to 60 minutes at a temperature of 250° to 400° C to complete the drying and initiate formation of the tantalum oxide passivation film 8 (FIG. 1) around the edge of the barrier. Completion of this film, and of the native oxide film 7 on the exposed upper surface of the N+ substrate can be effected by immersion of the wafer in a 30 percent solution of hydrogen peroxide for a period of 60 to 100 hours, under strong illumination.

Typically the illumination is provided by a 30 watt tungsten microscope lamp emitting light with a wavelength in the range of 3000A to 8000A. The light is focused to produce a beam having a generally square cross section with a width of 0.25 inches and is then directed at the gallium arsenide through the hydroen peroxide solution. The resulting native oxide film is about 500A to 1000A thick. The term "native oxide" is used herein to denote the oxide that forms under the described conditions. The composition of said oxide is not known with certainty at present, but is believed to be gallium oxide in amorphous form.

After passivation, the wafer is baked at 225° C in air for about 4 to 6 hours, then scribed or diced in usual manner to separate the individual diode chips like that of FIG. 1 for mounting in appropriate supporting and connection structures.

I claim:

1. A method of producing a passivation film on the surface of a body of gallium arsenide comprising the steps of:
   (a) cleaning the surface of said body,
   (b) oxidizing said surface by immersion in a hydrogen peroxide solution under strong illumination impinging on said surface long enough to produce an oxide film of about 500A to 1000A thick.

2. A method as claimed in claim 1, wherein said oxidant is nominally a 30 percent solution of hydrogen peroxide.

3. A method as claimed in claim 1, wherein step (b) comprises maintaining the gallium arsenide body in said solution for a period of 60 to 100 hours.

4. A method as claimed in claim 1, further comprising the steps of:

(a) etching the surface of said body subsequent to cleaning and prior to oxidizing, and (b) baking said body in an ambient gaseous oxidant at a temperature of 250° to 400° C for a period of 30 to 60 minutes subsequent to etching and prior to oxidizing.

5. A method as claimed in claim 1, further comprising the step of baking said body in a gaseous ambient for 4 to 6 hours at a temperature of about 225° C subsequent to oxidizing.

* * * * *